United States Patent [19]
Shibib

[11] Patent Number: 5,959,342
[45] Date of Patent: Sep. 28, 1999

[54] SEMICONDUCTOR DEVICE HAVING A HIGH VOLTAGE TERMINATION IMPROVEMENT

[75] Inventor: Muhammed Ayman Shibib, Wyomissing Hills, Pa.

[73] Assignee: Lucent Technologies Inc., Murray Hill, N.J.

[21] Appl. No.: 08/163,967

[22] Filed: Dec. 8, 1993

[51] Int. Cl.$^6$ .................................................. H01L 23/58
[52] U.S. Cl. ......................... 257/490; 257/488; 257/491; 257/495; 257/630
[58] Field of Search .................................. 257/488, 489, 257/490, 491, 495, 496, 630

[56] References Cited

U.S. PATENT DOCUMENTS

| | | | |
|---|---|---|---|
| 4,561,170 | 12/1985 | Doering et al. | 257/630 |
| 4,925,807 | 5/1990 | Yoshikawa | 257/488 |
| 4,947,232 | 8/1990 | Ashida et al. | 257/488 |
| 5,113,237 | 5/1992 | Stengl | 257/489 |
| 5,187,552 | 2/1993 | Hendrickson et al. | 257/488 |
| 5,204,545 | 4/1993 | Terashima | 257/490 |
| 5,208,471 | 5/1993 | Mori et al. | 257/489 |

FOREIGN PATENT DOCUMENTS

| | | | |
|---|---|---|---|
| 339322A2 | 11/1989 | European Pat. Off. | H01L 29/06 |
| 3046749A1 | 9/1981 | Germany . | |
| 3-171774 | 7/1991 | Japan | 257/489 |
| 4-14266 | 1/1992 | Japan | 257/489 |

OTHER PUBLICATIONS

IEEE Transactions on Consumer Electronics, vol. 36, No. 3, pp. 712–721.
Patent Abstracts of Japan, vol. 7, No. 94, Apr. 30, 1983, Nakagawa.
Peter W. Shackle, High Voltage And Smart Power Devices, 1987, Electronics and Dielectrics and Insulation Divisions Proceedings vol. 87–13, The Electrochemical Society, Inc., 10 South Main St. Pennington, NJ 08534–2896, pp. 79–129.

*Primary Examiner*—Ngân V. Ngô

[57] ABSTRACT

A high voltage semiconductor device having an improved junction termination extension for increasing the surface breakdown junction voltage. The device comprises a semiconductor substrate (10) of a first electrical conductivity type having a major surface (24) with an edge (26). The substrate has a first impurity region (22) of a second electrical conductivity type formed therein and having a first doping concentration and a second impurity region (28) of a said second electrical conductivity type, having a second doping concentration less than the first doping concentration, formed in the substrate between the first impurity region and the edge, and a field shield plate (30) disposed on the major surface in conductive relation with the first impurity region. The first field shield plate has an outer edge which terminates above the second impurity region.

3 Claims, 3 Drawing Sheets

SEMICONDUCTOR DEVICE HAVING A HIGH VOLTAGE TERMINATION IMPROVEMENT

BACKGROUND OF THE INVENTION

I. Field of the Invention

This invention pertains to semiconductor devices having improved high voltage terminations. More particularly, the present invention pertains to semiconductor devices having improved junction termination extensions which allow for an increased surface breakdown junction voltage. In addition, this invention pertains to a method of manufacturing semiconductor devices having improved junction termination extensions for increasing the surface breakdown junction voltage.

II. Background Art

Semiconductor devices having regions of alternate conductivity suffer breakdown when operated at high voltages. The specific voltage where breakdown occurs is the breakdown voltage. In planar high voltage technology where a P-N junction is diffused into a silicon substrate or wafer having a major surface, the portion of the device most susceptible to breakdown occurs at the region of the junction located on the major surface of the substrate (surface junction) which is in close proximity to the edge of the substrate.

For a given high voltage applied across a P-N junction, breakdown will occur at the surface junction sooner than at the junction region in the bulk of the substrate beneath the major surface because the presence of additional charges on the major surface results in a higher electric field at the major surface. This breakdown is referred to as surface junction breakdown.

In an effort to reduce the threat of surface junction breakdown, prior art semiconductor devices have employed field shield plates disposed on the major surface of the substrate over the surface junction to better distribute the electric field that exists on the major surface. In addition, the surface junction has also been extended by interposing at the surface junction between the P material and N material, a lightly doped region. Thus, for example, in a diode where a P region is formed in an N- substrate so that a P/N- surface junction is formed, a lightly doped P region (P-) is deposited at the surface between the P and N- regions, thereby creating a surface junction extension. The P- junction extension region forms a controlled gradient of the doping concentration between the P and N- regions of the device at the major surface which further reduces surface breakdown.

Semiconductor devices utilizing field shield plates and junction extensions are disclosed in C. A. Goodwin, et al, "A Dielectrically Isolated Bi-Polar CMOS-DMOS (BCDMOS) Technology For High Voltage Applications," Proceedings of the Symposium on High Voltage and Smart Power Devices, Vol. 87-13, pages 79–129. While such prior art devices have an improved high voltage termination over devices not utilizing field shield plates and junction extensions, such devices still suffer surface breakdown at about 350 volts. It is, therefore, desirable to have a high voltage semiconductor device having an increased high voltage termination.

Accordingly, it is an object of this invention to provide a semiconductor device having improved high voltage termination.

It is another object of the present invention to provide a junction extension and field shield plate configuration having an increased high voltage termination.

It is a further object of the present invention to provide a method for manufacturing semiconductor devices having an improved high voltage termination.

Other objects will become apparent as the following description proceeds.

The foregoing as well as additional details of the present invention will become apparent from the following detailed description and annexed drawings of the presently preferred embodiment thereof.

SUMMARY OF THE INVENTION

Broadly speaking, the present invention relates to a high voltage semiconductor device having an improved junction termination extension for increasing the surface breakdown junction voltage. The device comprises a semiconductor substrate of a first electrical conductivity type which defines a major surface having an edge, a first impurity region of a second electrical conductivity type formed in the substrate and having a first doping concentration, a second impurity region formed in the substrate between the first impurity region and the edge for forming a junction on the major surface between the second impurity region and the edge, the second impurity region being of the second electrical conductivity type and having a second doping concentration less than the first doping concentration. The device also has a first field shield plate disposed on the major surface directly above and in electrical contact with the first impurity region, the first field shield plate having an outer edge terminating directly above the second impurity region before the junction. A first layer of insulating material is disposed on the major surface of the substrate and separates the first field shield plate from the second impurity region and a second layer of insulating material is disposed directly above the first field shield plate. A second field shield plate is disposed on the second layer of insulating material and in electrical contact with the first impurity region. The second field shield plate has an outer edge which terminates directly above the substrate and beyond the junction extension.

The present invention also relates to a method of manufacturing a high voltage semiconductor device having an improved junction termination extension for increasing the surface breakdown junction voltage. The method comprises the steps of (1) forming, on a semiconductor substrate having a first electrical conductivity type and defining a major surface having an edge, a first impurity region of a second electrical conductivity type having a first doping concentration; (2) forming a second impurity region in the substrate between the first impurity region and the edge so that a junction on the major surface between the second impurity region and the edge is created, the second impurity region being of a the second electrical conductivity type and having a second doping concentration less than the first doping concentration; (3) forming a first field shield plate on the major surface in conductive relation with the first impurity region, the first field shield plate having an outer edge terminating above the surface area of the second impurity region; and (4) disposing an insulating material on the major surface of the substrate for separating the first field shield plate from the second impurity region.

DESCRIPTION OF THE DRAWINGS

In the drawings, wherein like reference numerals denote like elements throughout the several views.

DETAILED DESCRIPTION OF THE PREFERRED EMBODIMENT

Figure 1:
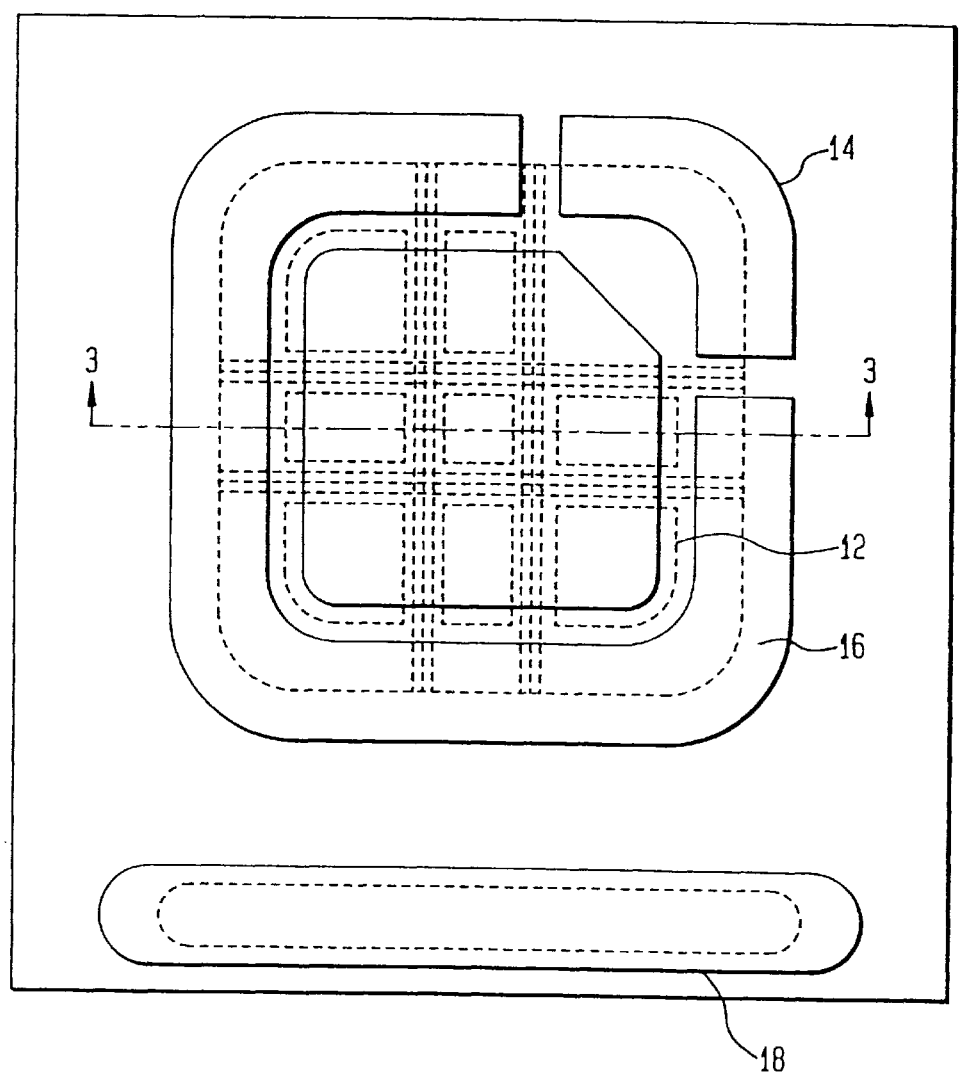
FIG. 1 is a top plan view of a nine-cell substrate containing parallel DMOS devices.

Referring now to the drawings and initially to FIG. 1, a silicon substrate or wafer 10 is shown containing eight parallel devices 12. The devices may be any type of semiconductor devices, such as, bipolar junction transistors (BJT), MOSFETs, diodes, etc. The substrate 10 contains three contact regions 14, 16, 18 for connecting to the devices 12. Thus, if device 12 is a DMOS transistor, contacts 14, 16, 18 would access the gate, source, and drain, respectively. If, on the other hand, device 12 was a diode, contacts 14 and 16 would be simply shorted together and would access the anode of the diode whereas contact 18 would access the cathode. It should be noted that, while substrate 10 is depicted showing eight parallel devices, it is contemplated that a single device or any other number of devices may be manufactured on the substrate 10 as well.

Figure 2A:
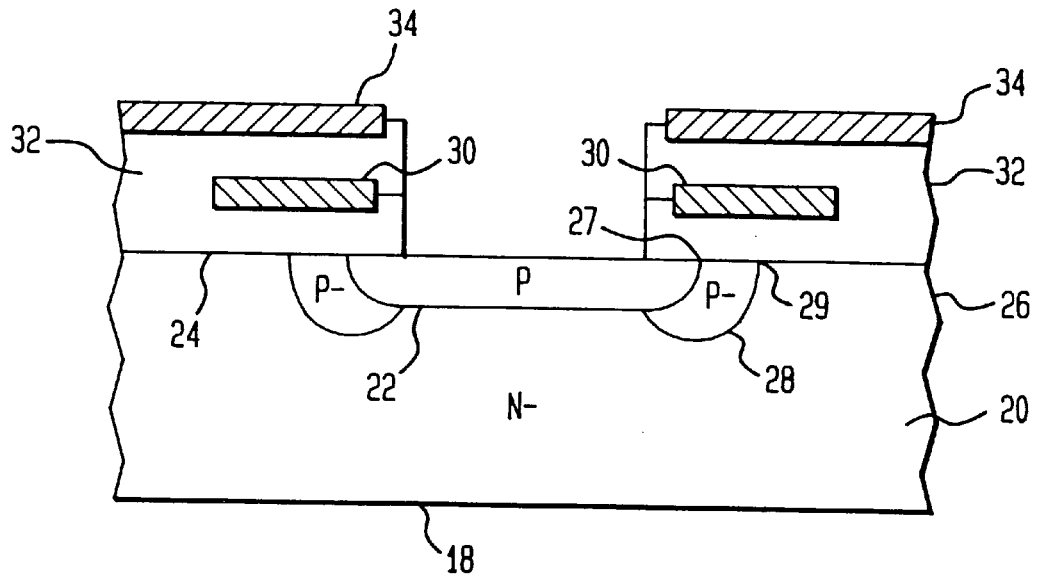
FIG. 2A is a cross-sectional view of a diode of the prior art.

Referring now to FIG. 2A, a cross-sectional view of a prior art diode contained on a substrate is shown. As shown, the substrate is an N− silicon material 20 having a major surface 24 and an edge 26. A P region 22 is implanted in the major surface 24 in a manner well known to those of ordinary skill in the art such as, by diffusion. This P region 22 creates a P/N− surface junction 27. P region 22 is surrounded by a ring of P− material which, likewise, may be implanted into the major surface 24 by diffusion or other known techniques. The P− region is of a certain width and thus, creates a junction extension region 28, thereby extending the P/N− surface junction 27 by a surface junction extension shown as 29. As explained above, the P− junction extension region 28 creates a controlled gradient of the doping concentrations on the surface, i.e. P region 22 to P− junction extension region 28 to N− silicon material 20. This increases the high voltage termination of the device above what it would be without the presence of junction extension region 28. The diode of FIG. 2A also contains a first field shield plate 30 and a second field shield plate 34. The field shield plates are separated by insulation material 32. In the preferred embodiment, shield plate 30 is made of polycrystalline silicon (polysilicon) and forms a portion of contact 14, shield plate 34 is made of metal, such as aluminum and forms a portion of contact 16, and the insulation material 32 is silicon dioxide ($SiO_2$).

Still referring to FIG. 2A, both shield plates 30, 34 fully cover the portion of major surface 24 above the junction extension region 28. In particular, in the prior art, the first shield plate 30 extends above the major surface 24 from the P region 22 to the N− silicon material 20. The second shield plate 34 extends above major surface 24 from the P region 22 to the edge 26. Both first and second field shield plates are connected to P region 22 in a manner well known to those of ordinary skill in the art.

Figure 2B:
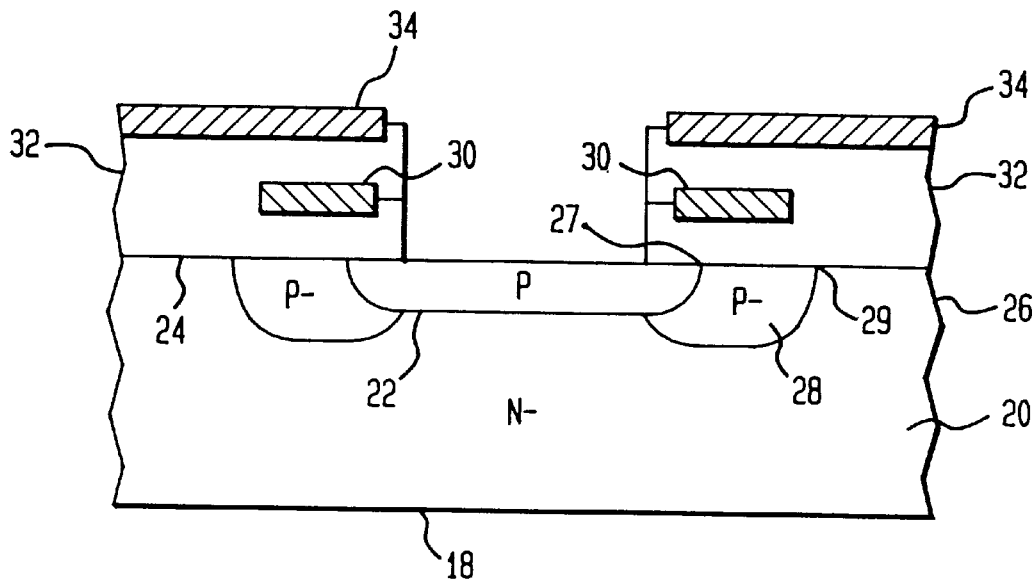
FIG. 2B is a cross-sectional view of a diode incorporating the improvement of the present invention.

Referring now to FIG. 2B, the improvement of the present invention is shown. As shown, first shield plate 30 extends above major surface 24 from P region 22 but terminates above major surface 24 at a location above junction extension region 28, i.e. before surface junction extension 29. This configuration results in an increased high voltage termination of the device. In addition, second shield plate 34, like the prior art, preferably extends from P region 22 to edge 26, thereby further shielding the covered region from external charges. Thus, starting from edge 26 of the device and moving inward along major surface 24 toward P region 22, it is shown that second field shield plate 34 extends to edge 26, then P− junction extension 28 terminates, and then first field shield plate 30 terminates over P− junction extension 28. I have found that this configuration extends the high voltage termination of the device significantly.

Figure 3A:
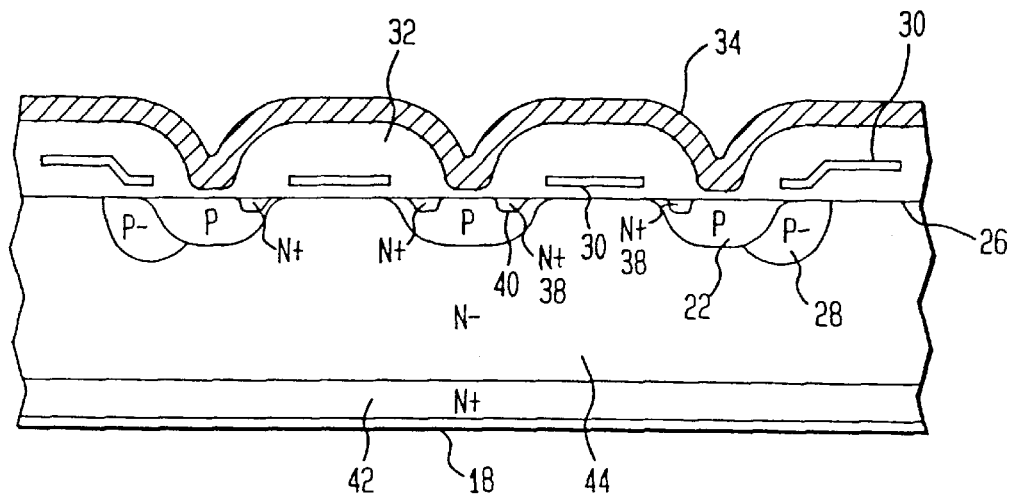
FIG. 3A is a cross-sectional view of FIG. 1 taken along the line 3—3, showing the junction extension and field shield configuration as used in the prior art.
Figure 3B:
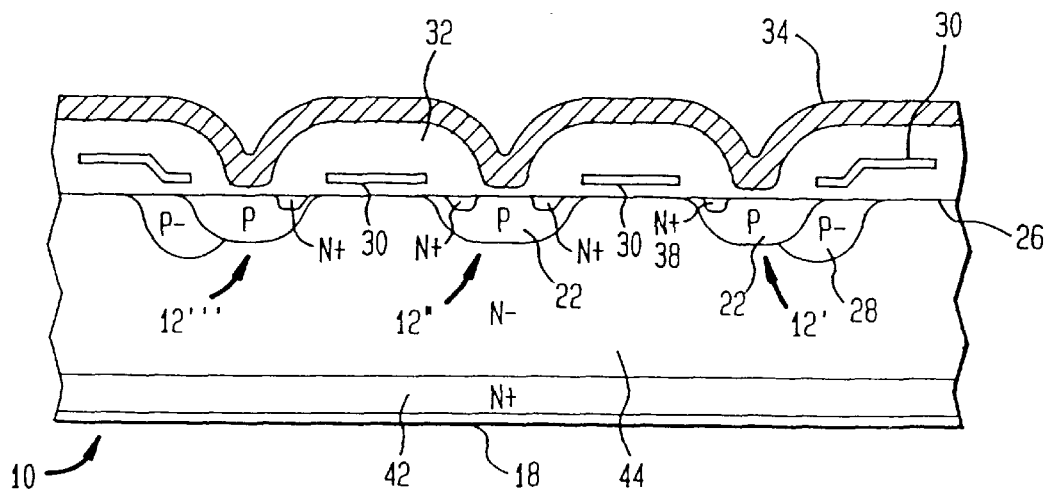
FIG. 3B is a cross-sectional view of FIG. 1 taken along the line 3—3 (like FIG. 3A) but showing the junction extension and field shield configuration in accordance with the present invention.

Turning now to FIGS. 3A and 3B, a cross-sectional view of FIG. 1 is shown in which several semiconductor devices are formed on one substrate. FIG. 3A depicts the cross-section of DMOS devices of the prior art and FIG. 3B depicts the cross-section of DMOS devices incorporating the improvement of the present invention. As shown, the central device 12″ does not have junction extension region 28 because, as this device is surrounded by other devices, namely, 12′ and 12′″, it is less susceptible to surface breakdown. In other words, only the portion of the devices proximate edge 26 are most susceptible to surface breakdown and thus, junction extension region 28 surrounds the outer portions of these outer devices, i.e. devices 12′ and 12′″.

Still referring to FIG. 3B, the DMOS devices are constructed on an N+ substrate 42 containing an N− layer thereon which is preferably, although not necessarily, epitaxially grown. Major surface 24 is masked in an appropriate manner and a P− junction extension region 28, preferably in the shape of a ring if a round substrate is used, is implanted thereon. Major surface 24 is then masked in an appropriate manner and P regions 22, which make up the body of the DMOS devices, are implanted into major surface 24 and, after further masking, N+ regions 38, which form the source of the devices, are implanted on major surface 24 into P regions 22. An insulation layer 32, which is preferably $SiO_2$, is grown on major surface 24 and gate and source terminals, corresponding to first field shield plate 30 and second field shield plate 34, respectively, are formed thereon. As shown, devices 12′ and 12′″ have a junction extension region 28 and two field shield plates 30, 34, configured in a manner described above in accordance with the present invention. As such, and as shown in FIG. 3B, first field shield plate 30 terminates above junction extension region 28 and second field shield plate 34 terminates after junction extension region 28 and preferably at edge 26. A DMOS device constructed in accordance with the present invention has an increased high voltage termination over the prior art and, experimentally I have found that the high voltage termination of a DMOS so constructed is approximately 30 volts higher than the high voltage termination of the prior art DMOS device of FIG. 3A. As should by now be apparent, the DMOS device of the present invention and, for that matter, any semiconductor device having a surface P-N junction which is constructed in accordance with the present invention, will have an increased high voltage termination and thus, such devices can be operated at higher voltages than their prior art counterparts without causing surface junction breakdown.

Now that I have shown the improvement of the present invention over the prior art, a process of fabrication will be briefly described. However, as semiconductor fabrication techniques are well known to those having ordinary skill in the art and as the improvement of the present invention lies in the configuration of the junction extension region 28 and the first and second field shield plates 30, 34, only the process pertaining to these elements will be described.

To obtain the improvement of the present invention, the first field shield plate 30 which, as explained above, is preferably of polysilicon material, is masked, such as by utilizing photoresist techniques, in a manner such that the shield plate 30 terminates above junction extension region 28, i.e. essentially shortening shield plate 30. Shield plate 30 is preferably 0.5 μm thick and, for an N channel DMOS, is doped N+ type by using, for example, phosphorous as a dopant. Shield plate 30 may be formed by a chemical vapor deposition (CVD) method as known in the art. A thick insulation layer 33 comprising of $SiO_2$ having a thickness of approximately 1.5 μm is deposited on first field shield plate 30 by a CVD method. Next, a second field shield plate which comprises the metal source terminal 34 is disposed above the entire major surface 26, thereby sandwiching insulating layer 33 between it and first field shield plate 30. The second field shield plate 34 is preferably formed by an evaporation process as is known to those of ordinary skill in the art and its thickness is preferably between 1–1.5 μm. In the preferred embodiment, the P− junction extension region 28 terminates 5 μm beyond the edge of first field shield plate 30 and second field shield plate 34 terminates 15 μm beyond the edge of the P− junction termination region 28. Thus, the lateral distance between the respective edges of first field shield plate 30 and second field shield plate 34 is approximately 20 μm. It should be noted that while I have described the method wherein the first field shield plate 30 is shortened so that it terminates above P− junction extension region 28, the reciprocal manufacturing process will create the same result. Namely, the P− junction extension region 28 may be alternatively extended beyond the edge of field shield plate 30 as opposed to simply shortening plate 30.

Although I have herein shown and described the currently preferred embodiment of the invention, various changes and modifications will be readily apparent to those of ordinary skill in the art who read the foregoing description. In addition, it should be noted that opposite conductivity semiconductor devices can be constructed by simply interchanging the P doped silicon regions with N doped silicon regions. Thus, the preferred embodiments and examples described herein are for illustrative purposes only and are not to be construed as limiting the scope of the present invention which is properly delineated only in the appended claims.

What is claimed is:

1. A high voltage semiconductor device having an improved junction termination extension for increasing the surface breakdown junction voltage, comprising:

a semiconductor substrate of a first electrical conductivity type, said substrate defining a major surface having an edge;

a first impurity region of a second electrical conductivity type formed in said substrate and having a first doping concentration;

a second impurity region formed in said substrate between said first impurity region and said edge and in contact with said first impurity region and extending on said major surface from said first impurity region to a junction extension remote from said first impurity region, said second impurity region being of said second electrical conductivity type and having a second doping concentration less than said first doping concentration;

a first field shield plate disposed on said major surface directly above and in electrical contact with said first impurity region, said first field shield plate having an outer edge terminating directly above said second impurity region before said junction extension;

a first layer of insulating material disposed on said major surface of said substrate and separating said first field shield plate from said second impurity region;

a second layer of insulating material disposed directly above said first field shield plate; and a second field shield plate disposed on said second layer of insulating material, directly above and in electrical contact with said first impurity region, and having an outer edge terminating directly above said substrate beyond said junction extension so that said junction extension is positioned on said major surface between the outer edge of said first field shield plate and the outer edge of said second field shield plate.

2. The device of claim 1, further comprising a third impurity region formed in said first impurity region, said third impurity region being of said first electrical conductivity type.

3. The device of claim 1, wherein said first field shield plate is comprised of polycrystalline silicon and wherein said second field shield plate is comprised of metal.

* * * * *